(12) United States Patent
Huang (10) Patent No.: US 11,963,330 B2
(45) Date of Patent: Apr. 16, 2024

(54) LIQUID-COOLING BLOCK AND LIQUID-COOLING BLOCK ASSEMBLY AND LIQUID-COOLING HEAT DISSIPATION DEVICE

(71) Applicant: Dongguan Hanxu Hardware Plastic Technology Co., Ltd., Guangdong (CN)

(72) Inventor: Tsung-Hsien Huang, Dongguan (CN)

(73) Assignee: DONGGUAN HANXU HARDWARE PLASTIC TECHNOLOGY CO., LTD., Guangdong (CN)

( * ) Notice: Subject to any disclaimer, the term of this patent is extended or adjusted under 35 U.S.C. 154(b) by 444 days.

(21) Appl. No.: 17/317,913

(22) Filed: May 12, 2021

(65) Prior Publication Data
US 2022/0256737 A1 Aug. 11, 2022

(30) Foreign Application Priority Data

Feb. 9, 2021 (CN) .......................... 202110174390.4

(51) Int. Cl.
*H05K 7/20* (2006.01)

(52) U.S. Cl.
CPC ....... *H05K 7/20272* (2013.01); *H05K 7/2039* (2013.01)

(58) Field of Classification Search
CPC ............. H05K 7/20272; H05K 7/2039; H05K 7/20327

USPC .......................................................... 165/80.4
See application file for complete search history.

(56) References Cited

U.S. PATENT DOCUMENTS

| | | | | |
|---|---|---|---|---|
| 10,509,446 | B2* | 12/2019 | Tsai | G06F 1/20 |
| 10,768,677 | B2* | 9/2020 | Lin | F04D 13/0673 |
| 11,236,738 | B2* | 2/2022 | Nakae | H05K 7/20254 |
| 11,297,735 | B2* | 4/2022 | Lai | F28D 1/04 |
| 11,406,041 | B1* | 8/2022 | Cai | H05K 7/20272 |
| 2017/0105313 | A1* | 4/2017 | Shedd | H05K 7/20309 |
| 2018/0340744 | A1* | 11/2018 | Tsai | F28D 15/00 |
| 2020/0141662 | A1* | 5/2020 | Huang | H05K 7/20254 |
| 2023/0014449 | A1* | 1/2023 | Huang | F28D 15/046 |
| 2023/0025369 | A1* | 1/2023 | Subrahmanyam | H05K 7/20836 |
| 2023/0156963 | A1* | 5/2023 | Liu | H05K 7/20781 361/679.53 |

* cited by examiner

*Primary Examiner* — Claire E Rojohn, III
(74) *Attorney, Agent, or Firm* — Leong C. Lei (57) ABSTRACT

A liquid-cooling block, a liquid-cooling block assembly, and a liquid-cooling heat dissipation device are disclosed. The liquid-cooling block includes a reservoir and a thermally conductive sheet. The reservoir has a liquid inlet, a first liquid outlet, a second liquid outlet, and a flow-dividing channel located inside the reservoir. A liquid inlet end of the flow-dividing channel is in communication with the liquid inlet. A liquid outlet end of the flow-dividing channel has a first flow-dividing opening and a second flow-dividing opening. The thermally conductive sheet is hermetically fixed to the reservoir to form a closed accommodating chamber therebetween. The thermally conductive sheet is integrally formed with a plurality of fins located in the accommodating chamber.

12 Claims, 13 Drawing Sheets

LIQUID-COOLING BLOCK AND LIQUID-COOLING BLOCK ASSEMBLY AND LIQUID-COOLING HEAT DISSIPATION DEVICE

BACKGROUND OF THE INVENTION

1. Field of the Invention

The present invention relates to a heat dissipation device, and more particularly to a liquid-cooling block, a liquid-cooling block assembly, and a liquid-cooling heat dissipation device.

2. Description of the Prior Art

A radiator for dissipating heat generated by the internal parts of a computer is generally a liquid-cooling radiator. A liquid-cooling radiator is configured to dissipate the heat of the radiator using a liquid under the action of a pump. Compared with air cooling, the liquid-cooling radiator has the advantages of quietness, stable cooling, and less dependence on the environment. The heat dissipation performance of the liquid-cooling radiator is proportional to the flow rate of a cooling liquid (water or other liquid). The flow rate of the cooling liquid is related to the power of the pump in the cooling system. Moreover, the heat capacity of liquid is large. This makes the liquid-cooling system have a good heat load capacity.

A conventional liquid-cooling heat dissipation device usually consists of a liquid-cooling radiator, a liquid-cooling block, and a liquid pipe. The liquid pipe is connected between the liquid-cooling radiator and the liquid-cooling block. The liquid-cooling block includes a casing, a pump installed inside the casing, a liquid inlet and a liquid outlet that are located on the surface of the casing. In practical applications, it still has some shortcomings as described below. The weight of the entire liquid-cooling block is relatively large. When it is installed and applied to a heat-generating electronic component, the required fastening pressure is large. The installation operation is laborious and time-consuming, and it is prone to shaking after installation. The entire liquid-cooling block is relatively large in size, and it is installed corresponding to the heat-generating electronic component. The space occupied is large, which is not conducive to the internal space design of computer products. Generally, one liquid-cooling radiator is set corresponding to one liquid-cooling block. It is difficult to meet the arrangement requirements of multiple liquid-cooling radiators for one liquid-cooling block. Therefore, it is necessary to improve the conventional liquid-cooling radiator.

SUMMARY OF THE INVENTION

In view of the defects of the prior art, the primary object of the present invention is to provide a liquid-cooling block, a liquid-cooling block assembly and a liquid-cooling heat dissipation device, which solves the problems in the prior art that the pump installed on the liquid-cooling block is heavy and is prone to shaking when the liquid is delivered and cannot be connected freely.

In order to achieve the above object, the present invention adopts the following technical solutions:

A liquid-cooling block comprises a reservoir and a thermally conductive sheet. The reservoir has a liquid inlet, a first liquid outlet, a second liquid outlet, and a flow-dividing channel located inside the reservoir. A liquid inlet end of the flow-dividing channel is in communication with the liquid inlet. A liquid outlet end of the flow-dividing channel has a first flow-dividing opening and a second flow-dividing opening. The first flow-dividing opening and the second flow-dividing opening each have a diameter less than that of the liquid inlet and the flow-dividing channel. The thermally conductive sheet is hermetically fixed to the reservoir to form a closed accommodating chamber therebetween. The thermally conductive sheet is integrally formed with a plurality of fins located in the accommodating chamber. The first flow-dividing opening is in communication with the first liquid outlet through the accommodating chamber. The second flow-dividing opening is in communication with the second liquid outlet. When a liquid flows into the flow-dividing channel through the liquid inlet, one part of the liquid flows into the accommodating chamber through the first flow-dividing opening and exchanges heat with the fins and then flows out from the first liquid outlet, and another part of the liquid flows out from the second liquid outlet through the second flow-dividing opening.

A liquid-cooling block assembly comprises a first liquid-cooling block and a second liquid-cooling block. The first liquid-cooling block is the aforesaid liquid-cooling block. The second liquid-cooling block has an inlet connection end and an outlet connection end. The second liquid outlet of the first liquid-cooling block is connected to the inlet connection end of the second liquid-cooling block.

A liquid-cooling heat dissipation device comprises a liquid-cooling radiator, a liquid-cooling block as mentioned above, a connecting tube connected between the liquid-cooling radiator and the liquid-cooling block, and a pump for circulating a liquid. The pump is arranged outside the liquid-cooling block.

Compared with the prior art, the present invention has obvious advantages and beneficial effects. Specifically, as can be seen from the above technical solutions, through the structural design of the liquid-cooling block and through the first flow-dividing opening and the second flow-dividing opening at the liquid outlet end of the flow-dividing channel, when a liquid flows into the flow-dividing channel through the liquid inlet, one part of the liquid flows into the accommodating chamber through the first flow-dividing opening and exchanges heat with the fins and then flows out from the first liquid outlet, and another part of the liquid flows out from the second liquid outlet through the second flow-dividing opening. In this way, multiple liquid-cooling blocks can be connected freely for heat dissipation.

Furthermore, arranging the pump on the outside of the liquid-cold block solves the problem that the conventional liquid-cooling block is heavy and shaking when the liquid is delivered. Besides, the overall height of the liquid-cooling block is reduced, and the liquid-cooling block occupies less space, which is conducive to the design of the internal space of computer products. The arrangement of the pump is more flexible and free, and the pump can be arranged anywhere outside, such as, the liquid-cooling radiator, the connecting tube, etc.

DETAILED DESCRIPTION OF THE PREFERRED EMBODIMENTS

FIGS. 1 to 13 show the specific structures of multiple embodiments of the present invention.

First, referring to FIGS. 1 to 7, a liquid-cooling block comprises a reservoir 1 and a thermally conductive sheet 2.

The reservoir 1 has a liquid inlet 11, a first liquid outlet 12, a second liquid outlet 13, and a flow-dividing channel 14 located inside the reservoir 1. A liquid inlet end of the flow-dividing channel 14 is in communication with the liquid inlet 11. A liquid outlet end of the flow-dividing channel 14 has a first flow-dividing opening 15 and a second flow-dividing opening 16. The first flow-dividing opening 15 and the second flow-dividing opening 16 each have a diameter less than that of the liquid inlet 11 and the flow-dividing channel 14.

The thermally conductive sheet 2 is hermetically fixed to the reservoir 1 to form a closed accommodating chamber 12 therebetween. The thermally conductive sheet 2 is integrally formed with a plurality of fins 21 located in the accommodating chamber 12. In production, the thermally conductive sheet 2 and the fins 21 are integrally formed.

The first flow-dividing opening 15 is in communication with the first liquid outlet 12 through the accommodating chamber 12. The second flow-dividing opening 16 is in communication with the second liquid outlet 13. When the liquid flows into the flow-dividing channel 14 through the liquid inlet 11, one part of the liquid flows into the accommodating chamber 12 through the first flow-dividing opening 15 and exchanges heat with the fins 21 and then flows out from the first liquid outlet 12, and the other part of the liquid flows out from the second liquid outlet 13 through the second flow-dividing opening 16. Preferably, the liquid inlet 11 and the first liquid outlet 12 are arranged on one side of the reservoir 1, and the second liquid outlet 13 is arranged on the other side of the reservoir 1.

Figure 7:
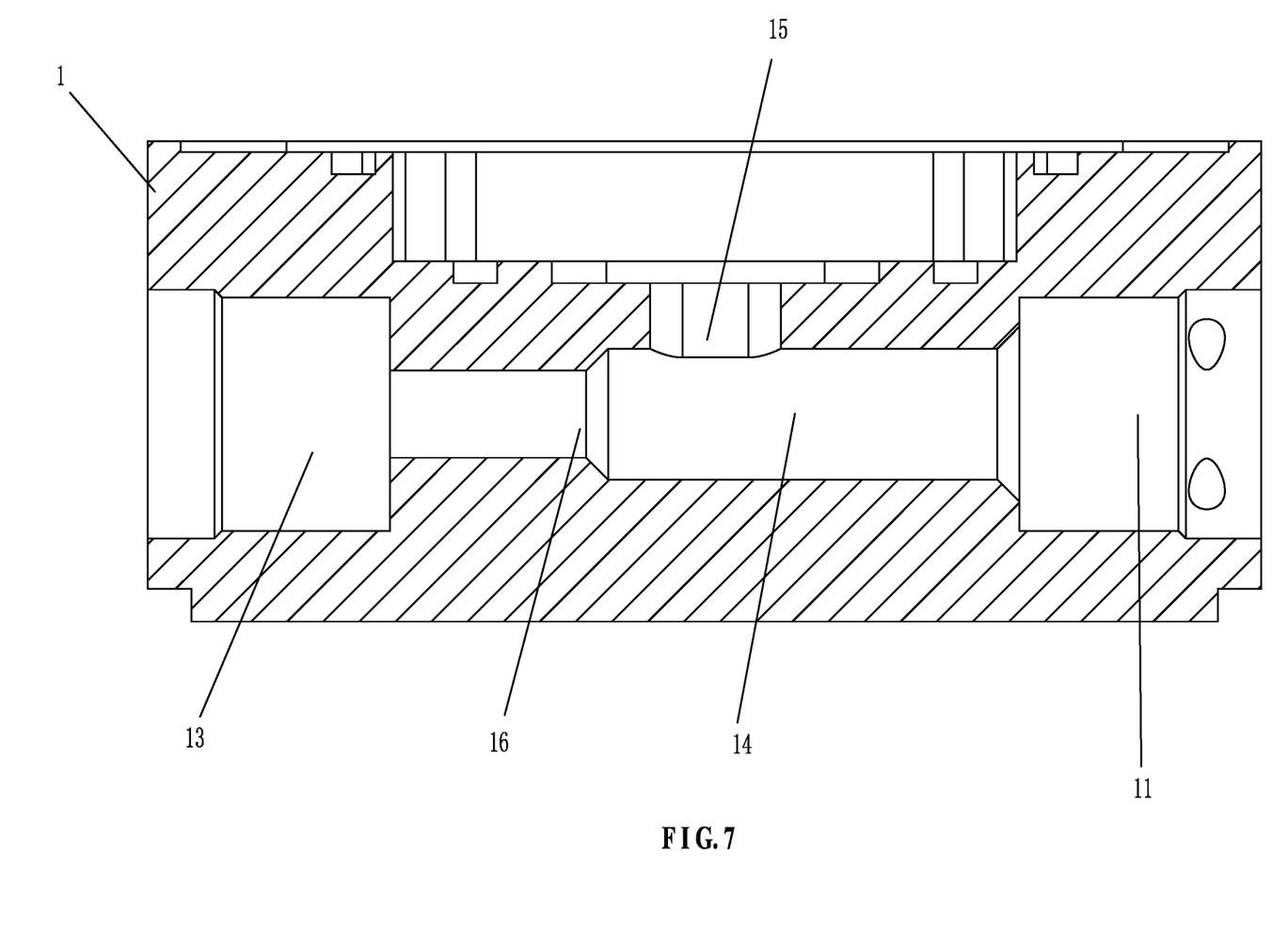
FIG. 7 is a cross-sectional view taken along line A-A of FIG. 6.

Specifically, the liquid inlet 11 and the second flow-dividing opening 16 are aligned with each other and located at opposing two ends of the flow-dividing channel 14, respectively. The first flow-dividing opening 15 is located between the two ends of the flow-dividing channel 14. The second flow-dividing opening 16 is in communication with the flow-dividing channel 14 through a transition channel that is gradually reduced along the delivery direction, so that a certain resistance is formed when the liquid is divided toward the second flow-dividing opening 16. In this way, the liquid can be divided well, avoiding the situation that a large amount of liquid is delivered from the first flow-dividing opening 15 or the second flow-dividing opening 16 and taking into account the delivery volume of the first flow-dividing opening 15 and the second flow-dividing opening 16. As shown in FIG. 7, the liquid inlet 11 is in communication with the liquid inlet end of the flow-dividing channel 14 through a transition channel that is gradually reduced along the delivery direction, so that the liquid flowing into the reservoir 1 is collected and the pressure increases.

As shown FIGS. 4 to 7 and FIG. 11, a partition lid 3 covering the fins 21 is provided in the accommodating chamber 12. The partition lid 3 divides the accommodating chamber 12 into a first liquid inlet chamber 1021 and a first liquid outlet chamber 1022. The first flow-dividing opening 15 is in communication with the first liquid inlet chamber 1021. The partition lid 3 has a first hole 31 communicating with the first liquid inlet chamber 1021 and the inside of the partition lid 3. The peripheral side of the partition lid 3 has a second hole 32 communicating with the first liquid outlet chamber 1022 and the inside of the partition lid 3. The first liquid outlet chamber 1022 is in communication with the first liquid outlet 12. In this way, the cold liquid flows to the inside of the partition lid 3 from the first hole 31 and is evenly distributed on the fins 21, with sufficient contact, and then flows out from the second hole 32, so that the cold liquid can be effectively guided to avoid the situation that the cold liquid and the hot liquid are mixed. Thus, the cold liquid is fully utilized for heat dissipation, and the heat dissipation effect is improved greatly.

In this embodiment, the thermally conductive sheet 2 has a square shape, and the thermally conductive sheet 2 is made of copper or aluminum. The thermally conductive sheet 2 made of copper has a better heat dissipation effect. The underside of the thermally conductive sheet 2 is flat. The thermally conductive sheet 2 is fixed to the bottom of the reservoir 1 by a plurality of screws (not shown in the figures). The periphery of the thermally conductive sheet 2 has a plurality of fixing holes. The bottom of the reservoir 1 has a plurality of screw holes. The screws are inserted through the corresponding fixing holes to be screwed to the corresponding screw holes.

The partition lid 3 is made of a metal or plastic material, and has a square shape. The center of the surface of the partition lid 3 has a recess. The bottom of the recess is provided with a plurality of spaced first holes 31, so that the cold liquid flowing into the partition lid 3 is distributed on the fins 21 evenly. The cold liquid improves the heat dissipation effect effectively. A first sealing ring 4 is sandwiched between the thermally conductive sheet 2 and the reservoir 1. A second sealing ring 5 is sandwiched between the periphery of the upper surface of the partition lid 3 and the reservoir 1. In addition, the first sealing ring 4 is square, and the second sealing ring 5 is circular. In actual design and manufacture, by adjusting the installation position of the partition lid 3, the position of the second hole 32 can be as low as possible, that is, the position of the liquid exit through the second hole 32 is as low as possible, and the heat dissipation effect is improved.

Figure 1:
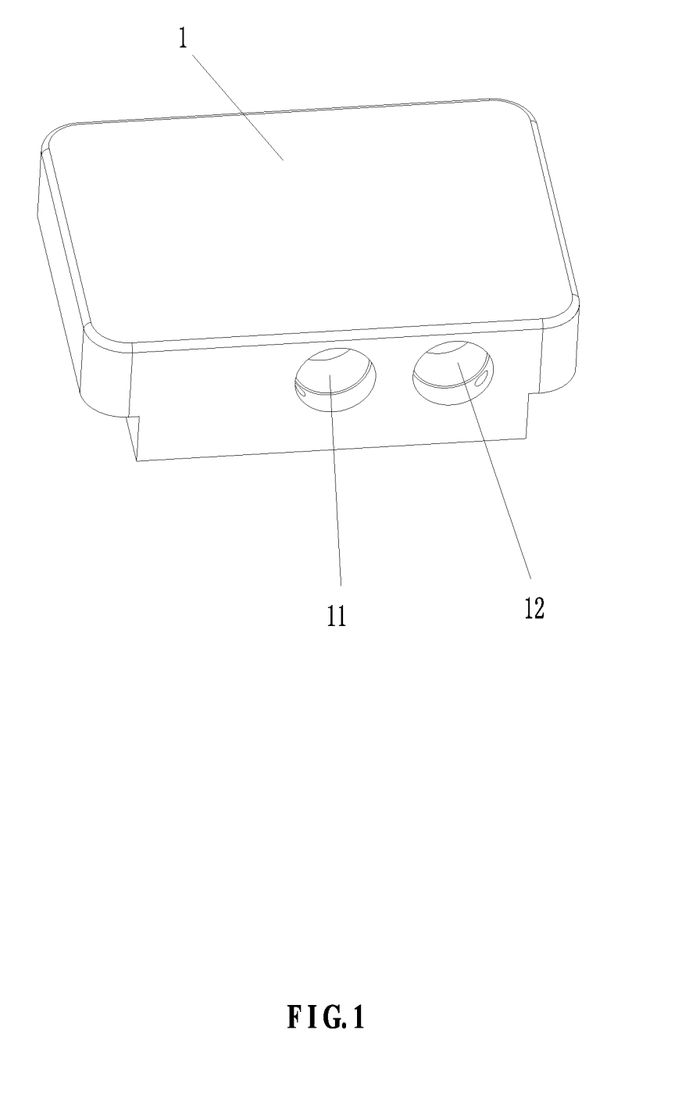
FIG. 1 is a perspective view of a first embodiment of the present invention.
Figure 2:
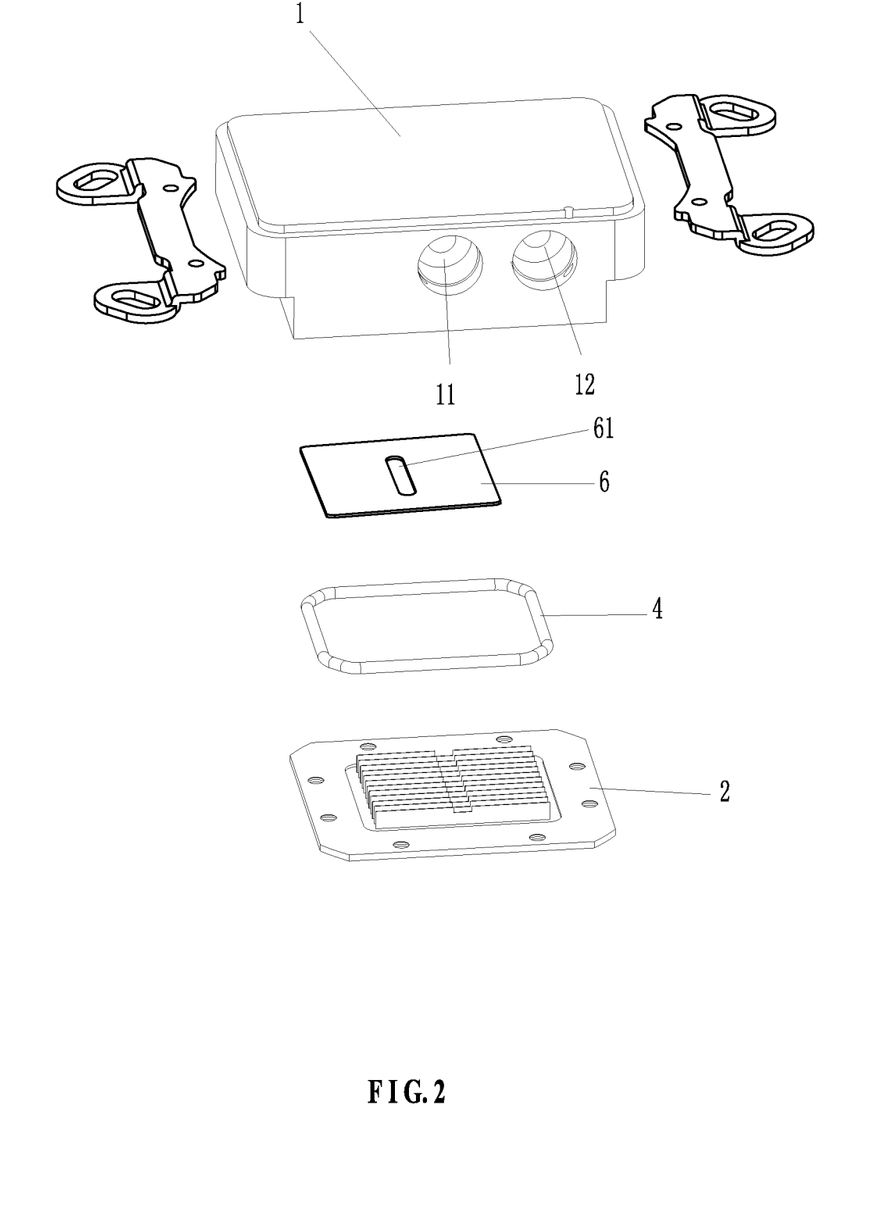
FIG. 2 is an exploded view of the first embodiment of the present invention.

As shown in FIG. 2, as an alternative, a partition sheet 6 covering the fins 21 is provided in the accommodating chamber 12. The partition sheet 6 divides the accommodating chamber 12 into a second liquid inlet chamber and a second liquid outlet chamber. The first flow-dividing opening 15 is in communication with the second liquid inlet chamber. The partition sheet 6 has a third hole 61 communicating with the second liquid inlet chamber and the area where the fins 21 are located. The second liquid outlet chamber is in communication with the first liquid outlet 12.

Figure 3:
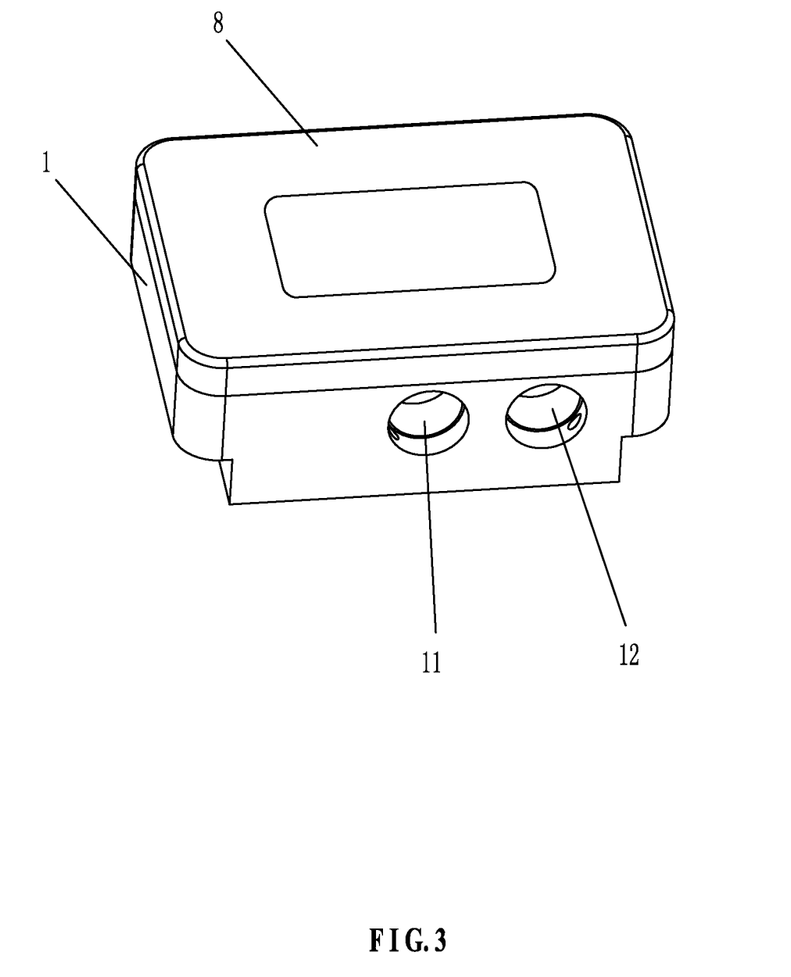
FIG. 3 is a perspective view of a second embodiment of the present invention.
Figure 4:
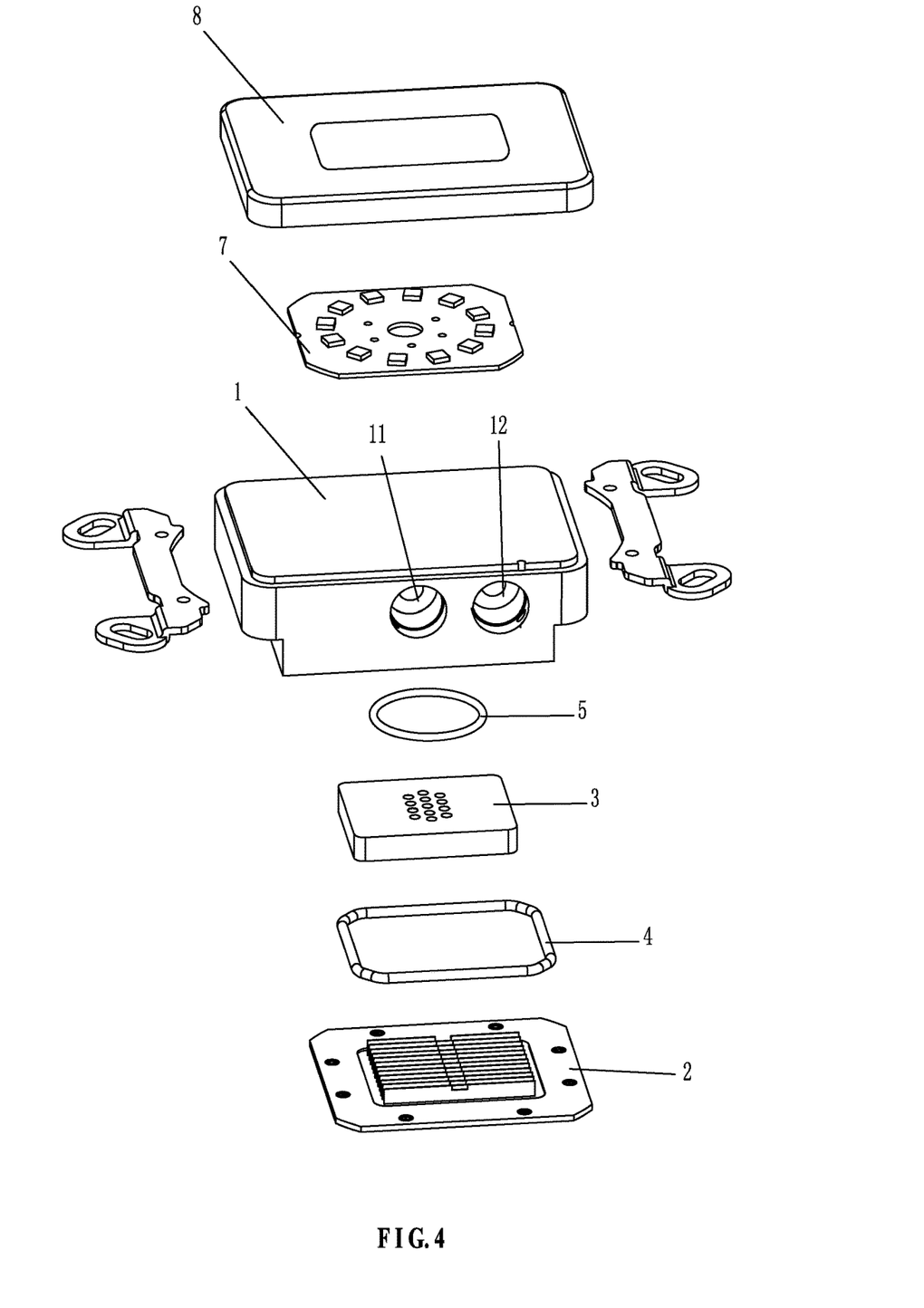
FIG. 4 is an exploded view of the second embodiment of the present invention.
Figure 5:
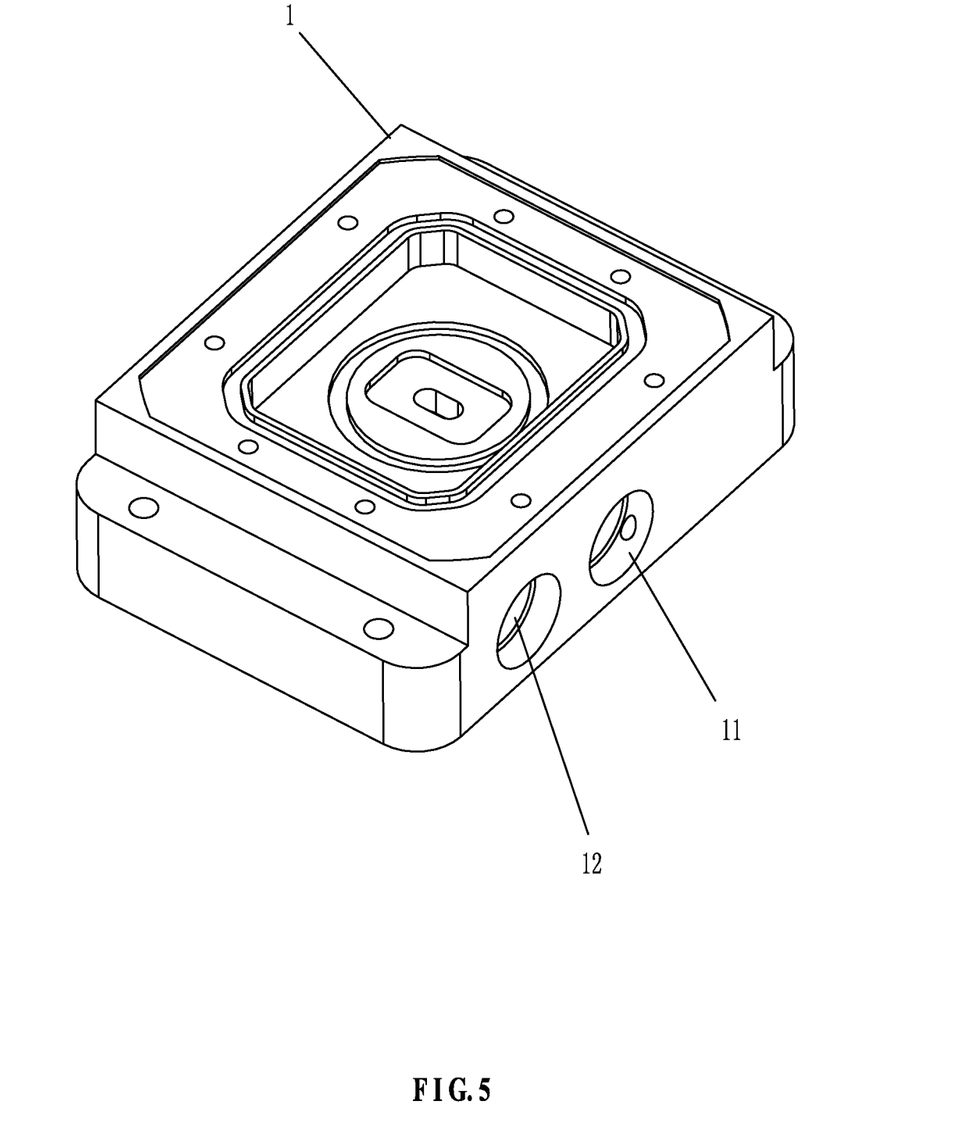
FIG. 5 is a perspective view of the reservoir of the second embodiment of the present invention.
Figure 6:
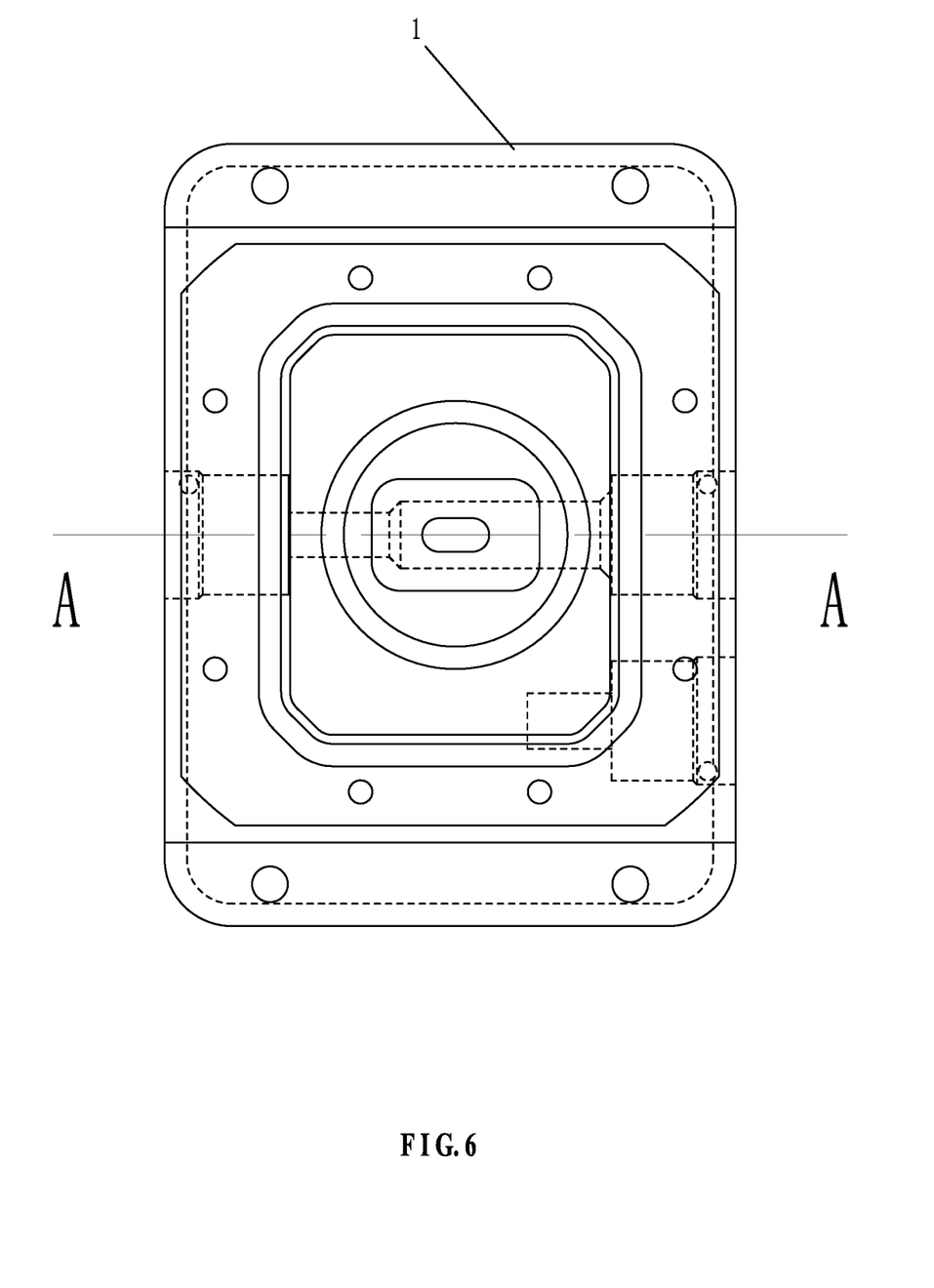
FIG. 6 is a bottom view of the reservoir of the second embodiment of the present invention.

As shown in FIG. 3 and FIG. 4, an LED board 7 is provided on the top of the reservoir 1. An upper cover 8 is provided on top of the LED board 7. The surface of the upper cover 8 is selectively decorated. Comparing FIG. 1 with FIG. 3, after the LED board 7, the upper cover 8 and other components are installed on the top of the reservoir 1, the overall height is slightly larger. However, compared with the conventional liquid-cooling block with a built-in pump, the overall height of the liquid-cooling block of the present invention is greatly reduced.

As shown in FIGS. 8 to 13, the present invention further provides a liquid-cooling block assembly, comprising a first liquid-cooling block 100 and a second liquid-cooling block 200. The first liquid-cooling block 100 is the aforementioned liquid-cooling block. The second liquid-cooling block 200 has an inlet connection end and an outlet connection end. The second liquid outlet 13 of the first liquid-cooling block 100 is connected to the inlet connection end of the second liquid-cooling block 200. The liquid inlet 11 of the first liquid-cooling block 100 is connected with a liquid inlet tube 501. The first liquid outlet 12 of the first liquid-cooling block 100 is connected with a first liquid outlet tube 502. The outlet connection end of the second liquid-cooling block 200 is connected with a second liquid outlet tube 503. The first liquid outlet tube 502 and the second liquid outlet tube 503 are collectively connected to a main liquid outlet tube 505.

Figure 13:
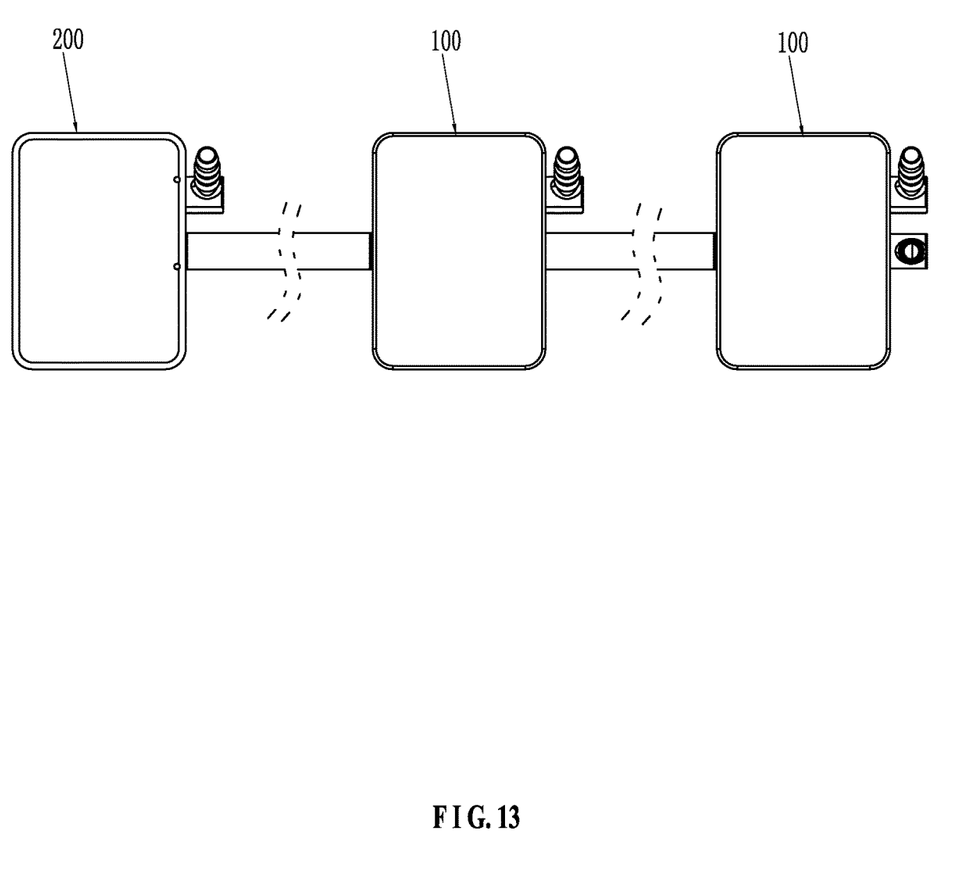
FIG. 13 is a schematic view of the assembly of two first liquid-cooling blocks and one second liquid-cooling block.

The first liquid-cooling block 100 may include one or a plurality of first liquid-cooling blocks. For every adjacent two of the first liquid-cooling blocks 100, the second liquid outlet 13 of a preceding one of the first liquid-cooling blocks 100 is connected to the liquid inlet 11 of a next one of the first liquid-cooling blocks 100.

Figure 8:
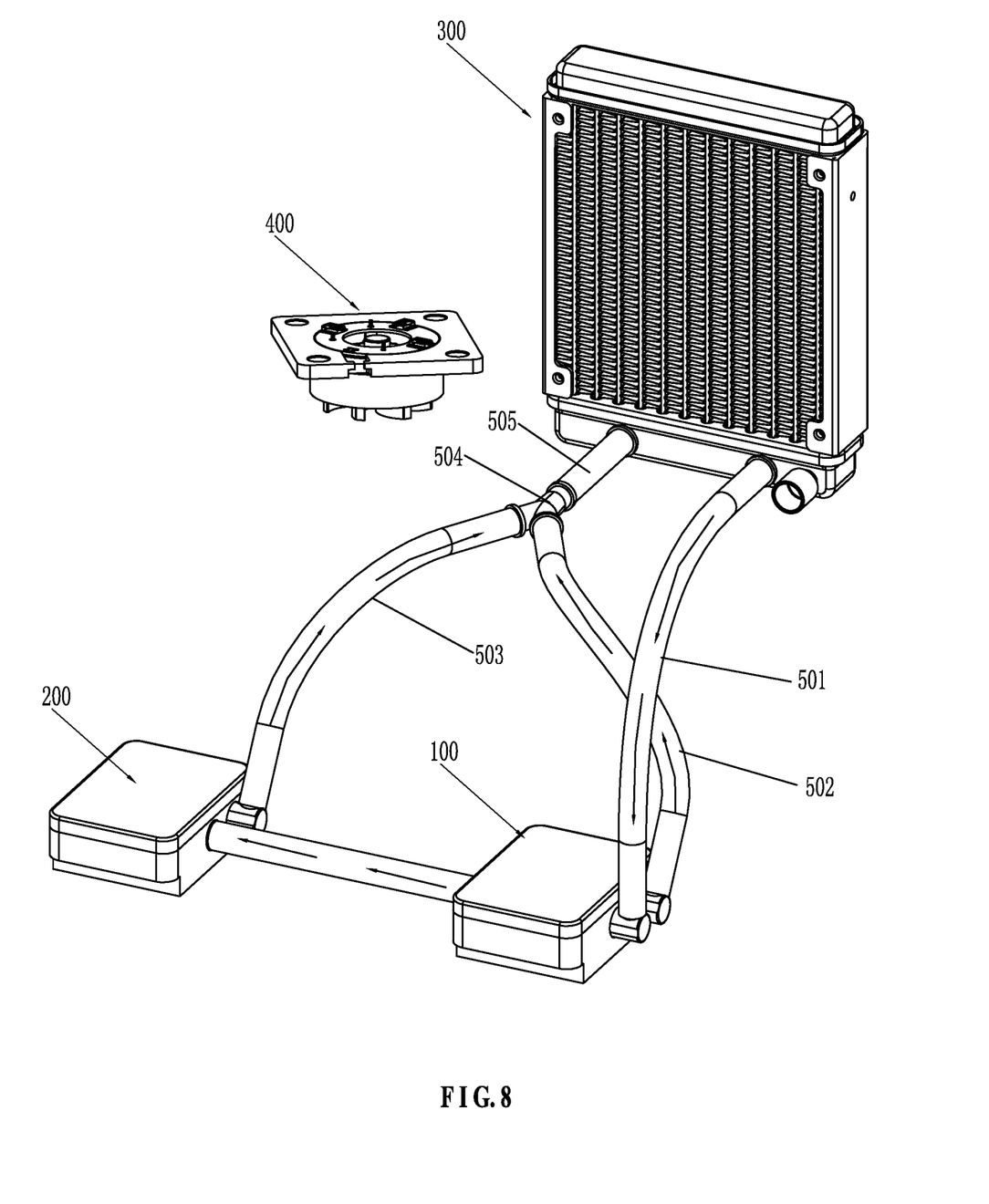
FIG. 8 is a perspective view of the second embodiment of the present invention applied to the liquid-cooling heat dissipation device.
Figure 9:
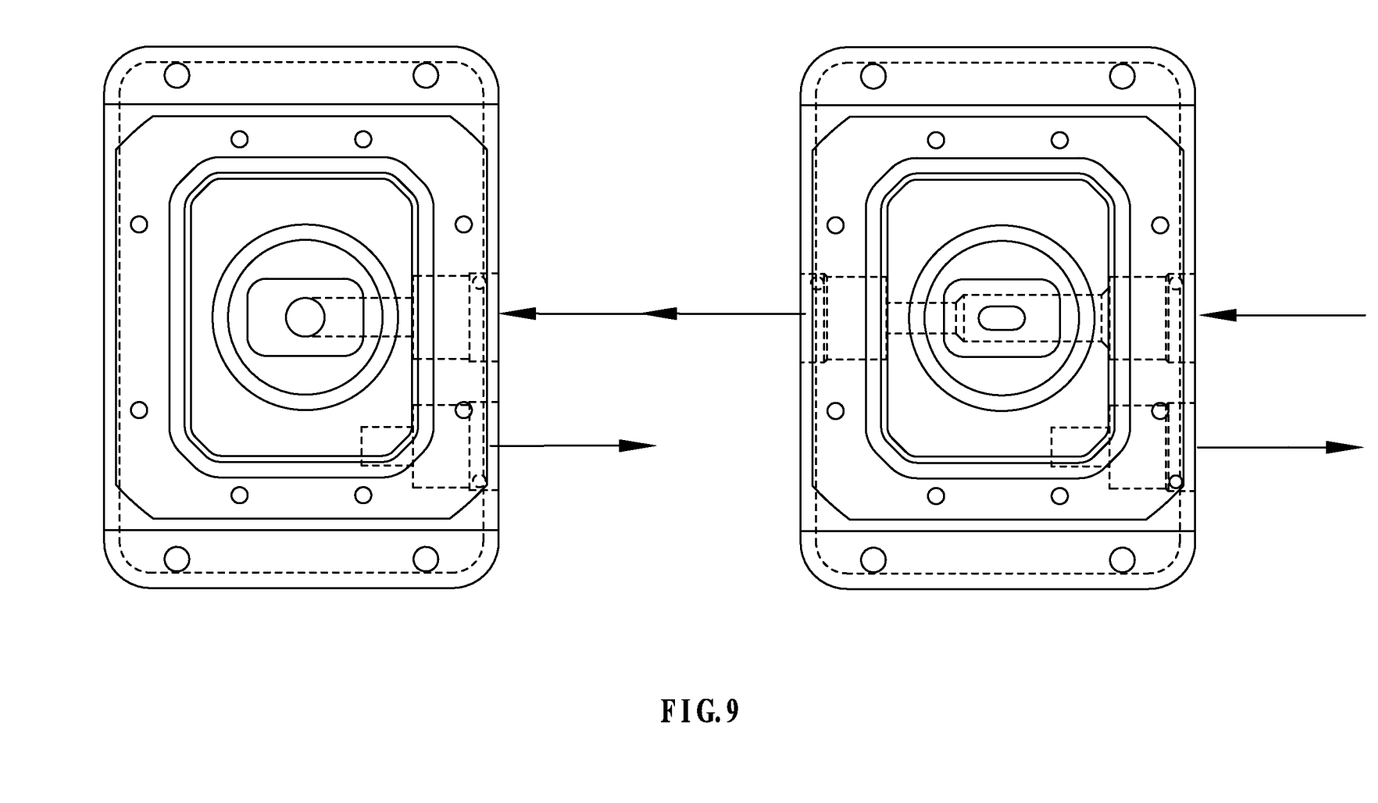
FIG. 9 is a schematic view showing the flow direction of the liquid of the first liquid-cooling block and the second liquid-cooling block of the liquid-cooling heat dissipation device shown in FIG. 8.
Figure 10:
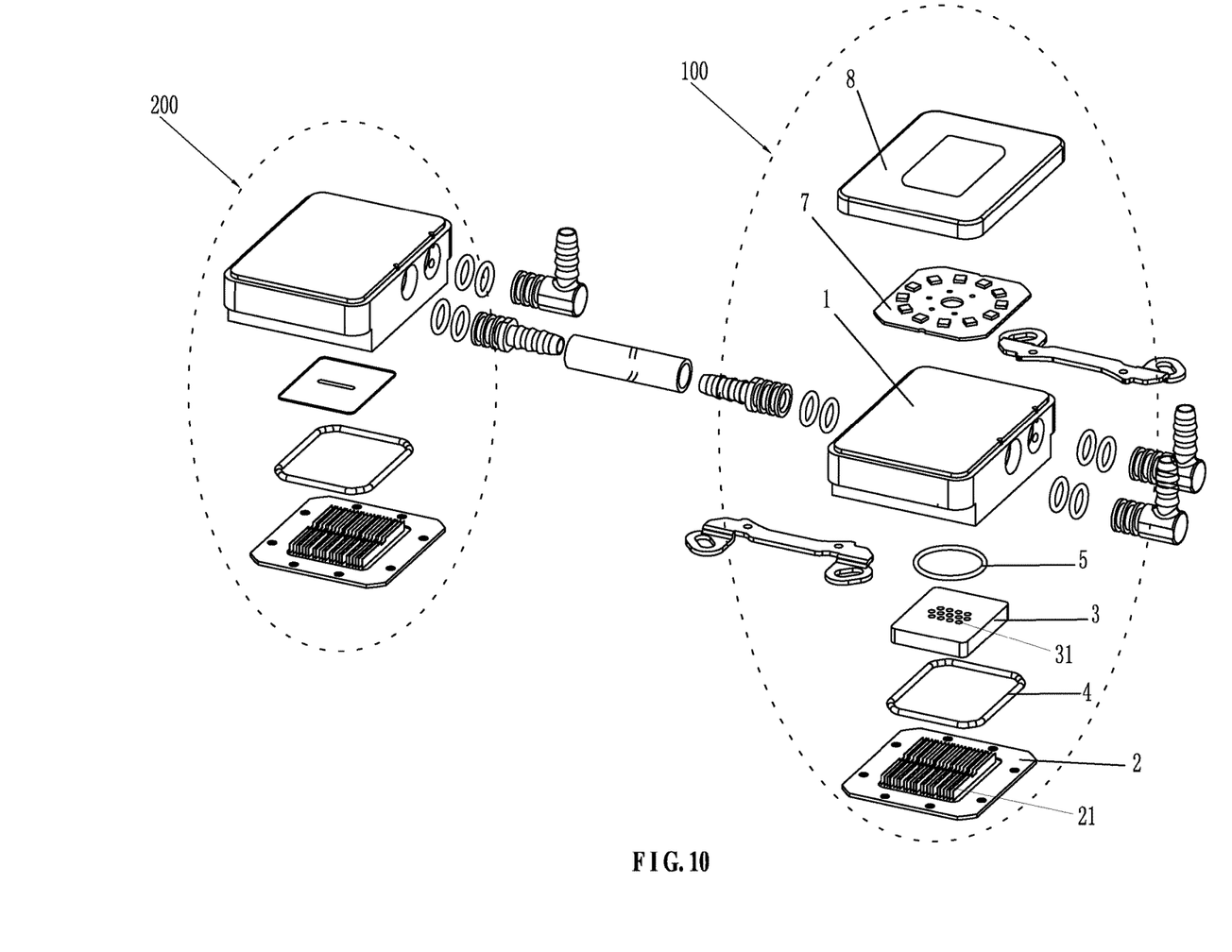
FIG. 10 is an exploded view of the first liquid-cooling block and the second liquid-cooling block of the liquid-cooling heat dissipation device shown in FIG. 8.

The present invention further provides a liquid-cooling heat dissipation device, comprising a liquid-cooling radiator 300, a liquid-cooling block, a connecting tube connected between the liquid-cooling radiator 300 and the liquid-cooling block, and a pump 400 for circulating a liquid. The liquid-cooling block includes the aforementioned liquid-cooling block. The pump 400 is arranged outside the liquid-cooling block. The arrangement of the pump 400 is flexible and free, and it can be arranged in any place outside, such as the liquid-cooling radiator 300, the connecting tube, etc. The liquid-cooling block assembly can be applied to the liquid-cooling heat dissipation device.

Figure 11:
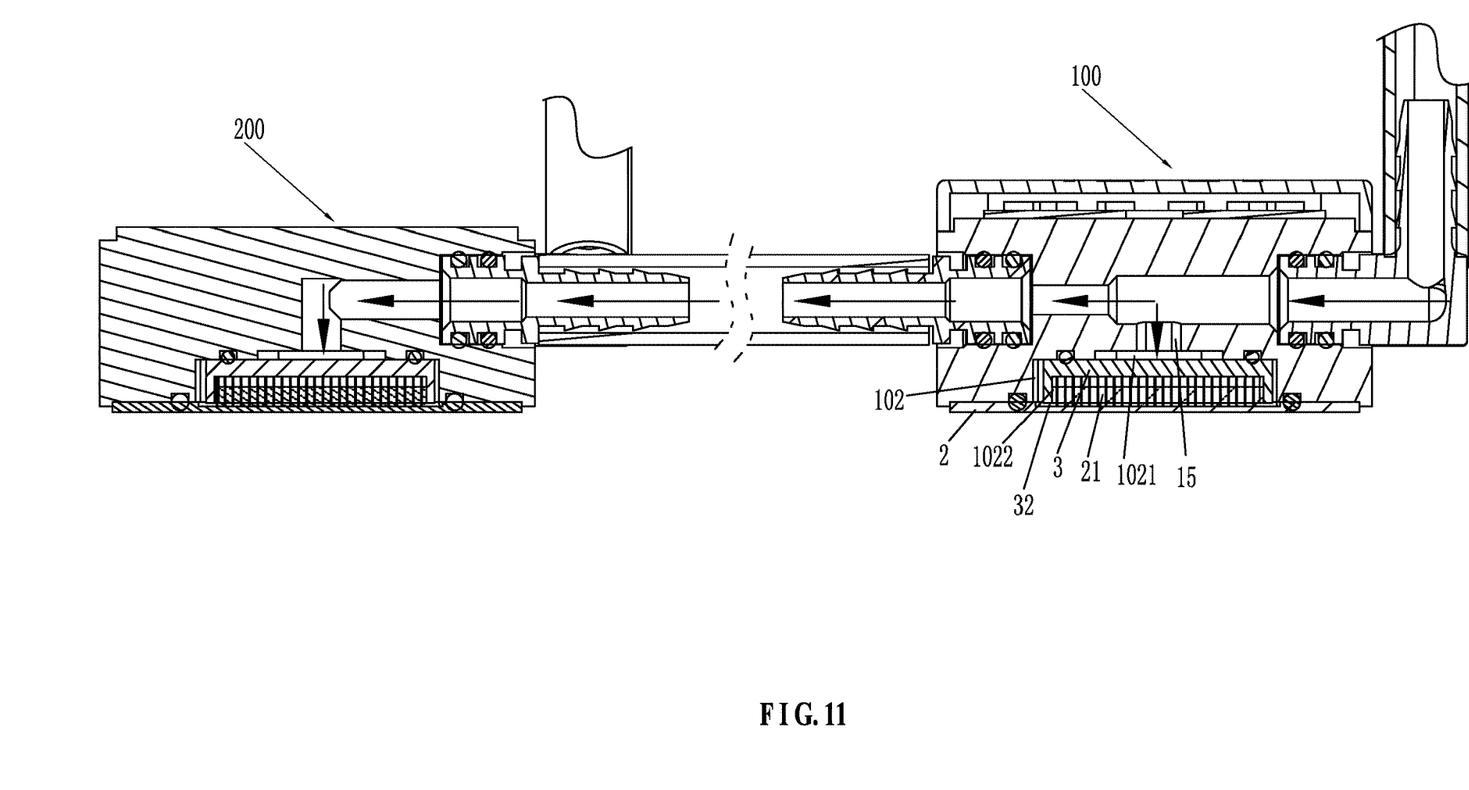
FIG. 11 is a cross-sectional view of the first liquid-cooling block and the second liquid-cooling block of the liquid-cooling heat dissipation device shown in FIG. 8.
Figure 12:
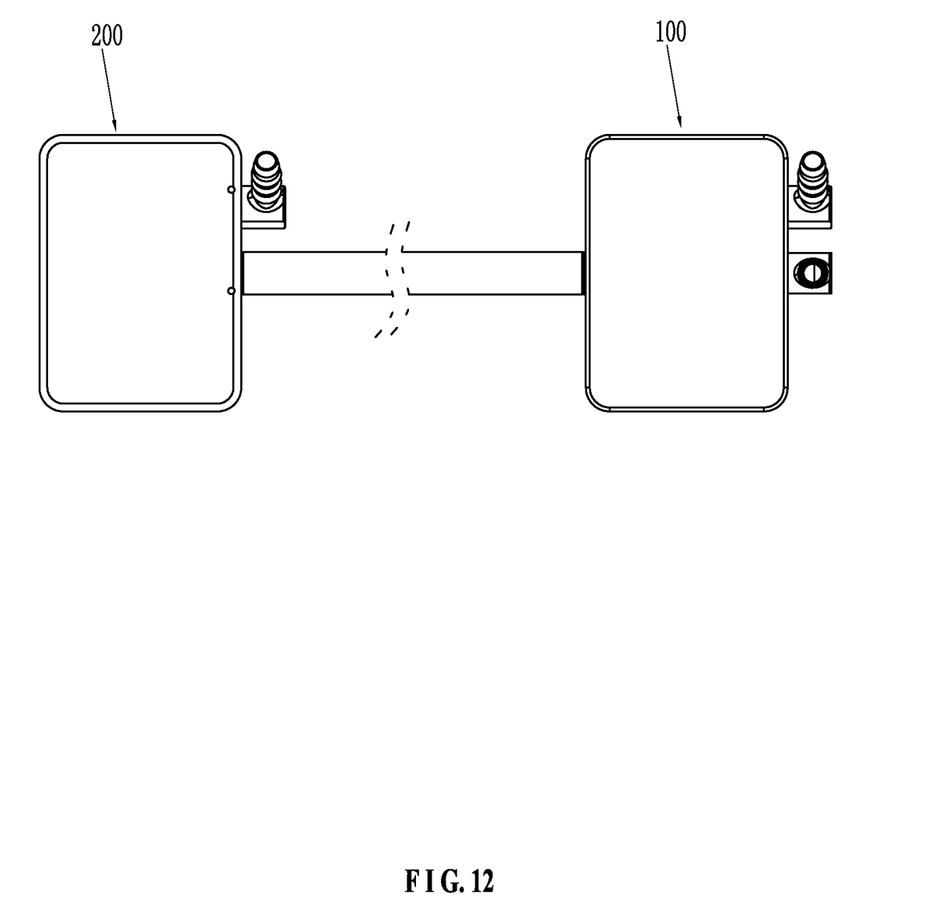
FIG. 12 is a schematic view of the assembly of one first liquid-cooling block and one second liquid-cooling block.

In cooperation with FIG. 8 and FIG. 11, the working principle of the liquid-cooling heat dissipation device is described as follows:

When in use, the thermally conductive sheets 2 of the first liquid-cooling block 100 and the second liquid-cooling block 200 are attached to the heat-generating electronic components, respectively. The liquid of the liquid-cooling radiator 300 flows into the flow-dividing channel 14 from the liquid inlet tube 501 through the liquid inlet 11 of the first liquid-cooling block 100. One part of the liquid flows into the accommodating chamber 12 through the first flow-dividing opening 15, and exchanges heat with the fins 21 and then flows out from the first liquid outlet 12 through the first liquid outlet tube 502. The other part of the liquid flows out from the second liquid outlet 13 through the second flow-dividing opening 16 and flows into the second liquid-cooling block 200, and then flows out through the second liquid outlet tube 503 of the second liquid-cooling block 200. The first liquid outlet tube 502 and the second liquid outlet tube 503 are connected to the main liquid outlet tube 505 via a three-way joint 504. The liquid flows into the liquid-cooling radiator 300 for cooling and recycling.

What is claimed is:

1. A liquid-cooling block, comprising a reservoir and a thermally conductive sheet;

the reservoir having a liquid inlet, a first liquid outlet, a second liquid outlet, and a flow-dividing channel located inside the reservoir; a liquid inlet end of the flow-dividing channel being in communication with the liquid inlet, a liquid outlet end of the flow-dividing channel having a first flow-dividing opening and a second flow-dividing opening, the first flow-dividing opening and the second flow-dividing opening each having a diameter less than that of the liquid inlet and the flow-dividing channel;

the thermally conductive sheet being hermetically fixed to the reservoir to form a closed accommodating chamber therebetween, the thermally conductive sheet being integrally formed with a plurality of fins located in the accommodating chamber;

the first flow-dividing opening being in communication with the first liquid outlet through the accommodating chamber, the second flow-dividing opening being in communication with the second liquid outlet, wherein when a liquid flows into the flow-dividing channel through the liquid inlet, one part of the liquid flows into the accommodating chamber through the first flow-dividing opening and exchanges heat with the fins and then flows out from the first liquid outlet, and another part of the liquid flows out from the second liquid outlet through the second flow-dividing opening and bypasses the thermally conductive sheet.

2. The liquid-cooling block as claimed in claim 1, wherein the liquid inlet and the second flow-dividing opening are aligned with each other and located at opposing two ends of the flow-dividing channel, and the first flow-dividing opening is located between the two ends of the flow-dividing channel.

3. The liquid-cooling block as claimed in claim 1, wherein the second flow-dividing opening is in communication with the flow-dividing channel through a transition channel that is gradually reduced along a delivery direction.

4. The liquid-cooling block as claimed in claim 1, wherein a partition lid covering the fins is provided in the accommodating chamber, the partition lid divides the accommodating chamber into a first liquid inlet chamber and a first liquid outlet chamber, the first flow-dividing opening is in communication with the first liquid inlet chamber, the partition lid has a first hole communicating with the first liquid inlet chamber and an inside of the partition lid, a peripheral side of the partition lid has a second hole communicating with the first liquid outlet chamber and the inside of the partition lid, and the first liquid outlet chamber is in communication with the first liquid outlet.

5. The liquid-cooling block as claimed in claim 1, wherein a partition sheet covering the fins is provided in the accommodating chamber, the partition sheet divides the accommodating chamber into a second liquid inlet chamber and a second liquid outlet chamber, the first flow-dividing opening is in communication with the second liquid inlet chamber, the partition sheet has a third hole communicating with the second liquid inlet chamber and an area where the fins are located, and the second liquid outlet chamber is in communication with the first liquid outlet.

6. The liquid-cooling block as claimed in claim 1, wherein the liquid inlet and the first liquid outlet are arranged on one side of the reservoir, and the second liquid outlet is arranged on another side of the reservoir.

7. A liquid-cooling block assembly, comprising a first liquid-cooling block and a second liquid-cooling block; the first liquid-cooling block is the liquid-cooling block as claimed in claim 1, the second liquid-cooling block has an inlet connection end and an outlet connection end, the second liquid outlet of the first liquid-cooling block is connected to the inlet connection end of the second liquid-cooling block.

8. The liquid-cooling block assembly as claimed in claim 7, wherein the liquid inlet of the first liquid-cooling block is connected with a liquid inlet tube, the first liquid outlet of the first liquid-cooling block is connected with a first liquid outlet tube, the outlet connection end of the second liquid-cooling block is connected with a second liquid outlet tube, the first liquid outlet tube and the second liquid outlet tube are collectively connected to a main liquid outlet tube.

9. The liquid-cooling block assembly as claimed in claim 7, wherein the first liquid-cooling block includes a plurality of first liquid-cooling blocks, for every adjacent two of the first liquid-cooling blocks, the second liquid outlet of a preceding one of the first liquid-cooling blocks is connected to the liquid inlet of a next one of the first liquid-cooling blocks.

10. A liquid-cooling heat dissipation device, comprising a liquid-cooling radiator, a liquid-cooling block as claimed in claim 1, a connecting tube connected between the liquid-cooling radiator and the liquid-cooling block, and a pump for circulating a liquid; the pump being arranged outside the liquid-cooling block.

11. The liquid-cooling heat dissipation device as claimed in claim 10, wherein the liquid-cooling block comprises a first liquid-cooling block and a second liquid-cooling block; the second liquid-cooling block has an inlet connection end and an outlet connection end, the second liquid outlet of the first liquid-cooling block is connected to the inlet connection end of the second liquid-cooling block, the liquid inlet of the first liquid-cooling block is connected with a liquid inlet tube, the first liquid outlet of the first liquid-cooling block is connected with a first liquid outlet tube, the outlet connection end of the second liquid-cooling block is connected with a second liquid outlet tube, the first liquid outlet tube and the second liquid outlet tube are collectively connected to a main liquid outlet tube.

12. The liquid-cooling heat dissipation device as claimed in claim 10, wherein the liquid-cooling block comprises a first liquid-cooling block and a second liquid-cooling block; the second liquid-cooling block has an inlet connection end and an outlet connection end, the second liquid outlet of the first liquid-cooling block is connected to the inlet connection end of the second liquid-cooling block, the liquid inlet of the first liquid-cooling block is connected with a liquid inlet tube, the first liquid outlet of the first liquid-cooling block is connected with a first liquid outlet tube, the outlet connection end of the second liquid-cooling block is connected with a second liquid outlet tube, the first liquid outlet tube and the second liquid outlet tube are collectively connected to a main liquid outlet tube; the first liquid-cooling block includes a plurality of first liquid-cooling blocks, for every adjacent two of the first liquid-cooling blocks, the second liquid outlet of a preceding one of the first liquid-cooling blocks is connected to the liquid inlet of a next one of the first liquid-cooling blocks.

\* \* \* \* \*